United States Patent
Zhong et al.

(10) Patent No.: US 9,881,994 B2
(45) Date of Patent: Jan. 30, 2018

(54) INSULATED GATE BIPOLAR TRANSISTOR AND MANUFACTURING METHOD THEREFOR

(71) Applicant: CSMC TECHNOLOGIES FAB1 CO., LTD., Wuxi New District (CN)

(72) Inventors: Shengrong Zhong, Wuxi New District (CN); Dongfei Zhou, Wuxi New District (CN); Xiaoshe Deng, Wuxi New District (CN); Genyi Wang, Wuxi New District (CN)

(73) Assignee: CSMC Technologies Fabl Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 14/902,284

(22) PCT Filed: Aug. 25, 2014

(86) PCT No.: PCT/CN2014/085082
§ 371 (c)(1),
(2) Date: Dec. 30, 2015

(87) PCT Pub. No.: WO2015/027878
PCT Pub. Date: Mar. 5, 2015

(65) Prior Publication Data
US 2016/0307995 A1  Oct. 20, 2016

(30) Foreign Application Priority Data
Aug. 27, 2013 (CN) .......................... 2013 1 0379443

(51) Int. Cl.
*H01L 21/332* (2006.01)
*H01L 29/06* (2006.01)
(Continued)

(52) U.S. Cl.
CPC ........ *H01L 29/0623* (2013.01); *H01L 21/761* (2013.01); *H01L 29/045* (2013.01);
(Continued)

(58) Field of Classification Search
CPC ............. H01L 29/1095; H01L 29/7397; H01L 29/6634; H01L 21/332
See application file for complete search history.

(56) References Cited

U.S. PATENT DOCUMENTS 4,567,641 A    2/1986 Baliga et al.
4,853,345 A *  8/1989 Himelick ............ H01L 21/2255
                                              257/E21.149
(Continued)

FOREIGN PATENT DOCUMENTS

CN       1525575      9/2004
CN     101976683      2/2011
(Continued)

OTHER PUBLICATIONS

Extended European Search Report for European application No. 14840868.5, dated Jan. 2, 2017 (11 pages).
(Continued)

*Primary Examiner* — Allen Parker
*Assistant Examiner* — Ismail Muse
(74) *Attorney, Agent, or Firm* — Hamre, Schumann, Mueller & Larson, P.C.

(57) ABSTRACT

An insulated gate bipolar transistor (100) is provided. A substrate (10) of the insulated gate bipolar transistor (100) is of an N type. A P-type region (16) is disposed on a back of the N-type substrate. A back metal structure (18) is disposed on a back of the P-type region (16). A terminal protection ring is disposed in a terminal structure. A polysilicon gate (31) is disposed on a front surface of the substrate (10) in an active region. Sidewalls (72) are disposed at two sides of the
(Continued)

polysilicon gate (31) on the substrate (10). An interlayer medium (81) covered with the polysilicon gate (31) and the sidewalls (72) is disposed on the substrate (10). The interlayer medium (81) is covered with a metal lead wire layer (91). An N-type carrier enhancement region (41) is disposed in the substrate (10) in the active region. A P-type body region (51) is disposed in the carrier enhancement region (41). An N-type heavily doped region (61) is disposed in the P-type body region (51). A P-type heavily doped region (71) is disposed in the N-type heavily doped region (61). An inward recessed shallow pit (62) with a depth of 0.15 to 0.3 micrometers is formed on a surface of the P-type heavily doped region (71). By disposing the carrier enhancement region (41), the carrier concentration of a channel can be increased and a forward voltage drop can be reduced; in addition, the shallow pit (62) can make a device obtain good impurity distribution and a large metal contact area, thereby improving the performance of the device.

10 Claims, 5 Drawing Sheets (51) Int. Cl.
H01L 29/66 (2006.01)
H01L 29/739 (2006.01)
H01L 29/10 (2006.01)
H01L 21/761 (2006.01)
H01L 29/04 (2006.01)
H01L 29/16 (2006.01)
H01L 29/161 (2006.01)
H01L 29/20 (2006.01)

(52) U.S. Cl.
CPC ...... *H01L 29/0619* (2013.01); *H01L 29/1095* (2013.01); *H01L 29/16* (2013.01); *H01L 29/161* (2013.01); *H01L 29/1608* (2013.01); *H01L 29/20* (2013.01); *H01L 29/6634* (2013.01); *H01L 29/66333* (2013.01); *H01L 29/7395* (2013.01); *H01L 29/7396* (2013.01)

(56) References Cited

U.S. PATENT DOCUMENTS

| | | | |
|---|---|---|---|
| 5,079,602 A | 1/1992 | Harada | |
| 5,155,052 A * | 10/1992 | Davies | 438/268 |
| 5,160,985 A | 11/1992 | Akiyama | |
| 5,843,796 A * | 12/1998 | Disney | H01L 29/7396 257/E21.385 |
| 6,110,763 A * | 8/2000 | Temple | H01L 21/26513 257/E21.336 |
| 6,403,432 B1 | 6/2002 | Yu et al. | |
| 6,429,481 B1 | 8/2002 | Mo et al. | |
| 7,456,070 B2 * | 11/2008 | Johnson | H01L 21/8249 257/E21.696 |
| 7,671,410 B2 * | 3/2010 | Zhao | H01L 29/0615 257/337 |
| 8,617,936 B2 * | 12/2013 | Rahimo | H01L 29/0834 257/E21.696 |
| 2003/0080377 A1 * | 5/2003 | Yedinak | H01L 29/1095 257/328 |
| 2006/0017111 A1 | 1/2006 | Kamiya et al. | |
| 2007/0210350 A1 * | 9/2007 | Omura | H01L 23/4824 257/287 |
| 2008/0157117 A1 | 7/2008 | McNutt et al. | |
| 2014/0284705 A1 * | 9/2014 | Eguchi | H01L 29/66712 257/329 |
| 2016/0379974 A1 * | 12/2016 | Zhang | H01L 29/66333 438/138 |

FOREIGN PATENT DOCUMENTS

| | | |
|---|---|---|
| CN | 102496573 | 6/2012 |
| CN | 102969243 | 3/2013 |
| CN | 102969351 | 3/2013 |
| CN | 103035519 | 4/2013 |
| EP | 0755077 | 1/1997 |

OTHER PUBLICATIONS

International Search Report of PCT/CN2014/085082 dated Nov. 26, 2014, and English translation thereof, 6 pages total.

* cited by examiner

INSULATED GATE BIPOLAR TRANSISTOR AND MANUFACTURING METHOD THEREFOR

FIELD OF THE INVENTION

The present invention relates to a method of manufacturing a semiconductor device, particularly relates to an insulated gate bipolar transistor, and further relates to a method of manufacturing the insulated gate bipolar transistor.

BACKGROUND OF THE INVENTION

The insulated gate bipolar transistor (IGBT) generally is a power semiconductor device consisting of a bipolar junction transistor (BJT) and a metal oxide semiconductor field effect transistor (MOS). A conduction voltage drop of a conventional insulated gate bipolar transistor is much high.

SUMMARY OF THE INVENTION

On the basis of this, it is necessary to provide an insulated gate bipolar transistor with a low conduction voltage drop.

An insulated gate bipolar transistor comprises a peripheral terminal structure and an active region surrounded by the terminal structure, a substrate of the insulated gate bipolar transistor being an N-type substrate, a back side of the N-type substrate being disposed with an P-type region, a back side of the P-type region being disposed with a backside metal structure, a terminal guard ring being disposed in the terminal structure, a front side of the substrate of the active region being disposed with a polysilicon gate, both sides of the polysilicon gate on the substrate being disposed with a spacer, an interlayer dielectric being disposed on the substrate covering the polysilicon gate and the spacer, the interlayer dielectric being covered by a metal lead layer; an N-type carrier enhanced region is disposed in the substrate of the active region, a P-body region is disposed in the carrier enhanced region, an N-type heavily doped region is disposed in the P-body region, a P-type heavily doped region is disposed in the N-type heavily doped region, a surface of the P-type heavily doped region forms a dishing area dished inwardly, an inwardly dishing depth of the dishing area with respect to the substrate at both sides is 0.15 micron to 0.3 micron.

In one of embodiments, the substrate is made of silicon, silicon carbide, gallium arsenide, indium phosphide orgermanium-silicon.

In one of embodiments, the substrate is made of a monocrystal silicon with a crystal orientation of <100>.

The invention further provides a method of manufacturing an insulated gate bipolar transistor.

A method of manufacturing an insulated gate bipolar transistor comprises: providing a substrate, forming a field oxide layer on a front side of the substrate, photoetching and etching the field oxide layer by using a terminal guard ring photomask, and forming a terminal guard ring by implanting P-type ions to the substrate under the etched area; photoetching and etching the field oxide layer of an active region by using an active region photomask, and depositing polysilicon on the substrate where the field oxide layer being etched, forming a protecting layer on the deposited polysilicon; and forming a polysilicon gate by photoetching and etching a surplus of the polysilicon and the protecting layer by using a polysilicon photomask; photoetching and etching the polysilicon gate by using a P well photomask, implanting N-type ions to the substrate under the etched polysilicon gate, and forming a carrier enhanced region after performing a driving-in process; photoetching the carrier enhanced region by using the P well photomask and implanting P-type ions to the carrier enhanced region, and forming a P-body region after performing a driving-in process; self-alignedly implanting N-type ions to the P-body region by using the polysilicon gate, and forming an N-type heavily doped region after performing a driving-in process; forming a spacer at both sides of the polysilicon gate, then implanting P-type ions to the N-type heavily doped region, and forming a P-type heavily doped region after performing a driving-in process; and forming an interlayer dielectric, performing a front metalized process of the insulated gate bipolar transistor, performing backgrinding, implanting of P-type ions and an annealing process, and performing a backside metalized process of the insulated gate bipolar transistor.

In one of embodiments, after forming the spacer at both sides of the polysilicon gate and prior to implanting P-type ions to the N-type heavily doped region, the method further comprises forming a dishing area by etching the N-type heavily doped region, wherein an inwardly dishing depth of the dishing area with respect to the substrates at both sides is 0.15 micron to 0.3 micron.

In one of embodiments, forming the protecting layer on the deposited polysilicon comprises forming a first oxide layer at a surface of the polysilicon, and depositing a silicon nitride layer at a surface of the first oxide layer.

In one of embodiments, after performing the front metalized process of the insulated gate bipolar transistor, the method further comprises implanting P-type ions to the P-type heavily doped region again.

In one of embodiments, in the step of forming the terminal guard ring by implanting P-type ions to the substrate under the etched area, the P-type ions are boron ions; in the step of implanting N-type ions to the substrate under the etched polysilicon gate, the N-type ions are phosphorous ions; in the step of photoetching the carrier enhanced region by using a P well photomask and implanting P-type ions to it, the P-type ions are boron ions; in the step of self-alignedly implanting N-type ions to the P-body region by using the polysilicon gate, the N-type ions are arsenic ions; in the step of implanting P-type ions to the N-type heavily doped region, the P-type ions are boron ions; in the step of implanting and doping polysilicon to the polysilicon gate after removing the protecting layer, the implanted ions are phosphorous ions.

In one of embodiments, forming the spacer at both sides of the polysilicon gate comprises: depositing a second oxide layer, then removing a surplus of the second oxide layer by corroding, and forming the spacer by the remaining part of the second oxide layer.

In one of embodiments, performing the front metalized process of the insulated gate bipolar transistor comprises forming a contact hole by performing photoetching and etching processes by using a contact hole photomask, and sputtering a conductive metal on the interlayer dielectric, then forming a metal lead layer covering the interlayer dielectric by photoetching and etching the sputtered metal with a metal photomask.

In the insulated gate bipolar transistor described above, by forming a carrier enhanced region, a concentration of carriers in a channel can be increased and then the conduction voltage drop can be reduced. Meanwhile, a shallow dishing of 0.15 micron to 0.3 micron is formed in the P-type heavily doped region, which results in a better impurity distribution and a greater metal contacting area for the device, reducing the power consumption, improving reliability of product, and further reducing the conduction voltage.

DETAILED DESCRIPTION OF THE EMBODIMENTS

The details of one or more embodiments of the invention are set forth in the accompanying drawings and the description below. Other features, objects, and advantages of the invention will be apparent from the description and drawings, and from the claims.

Figure 1:
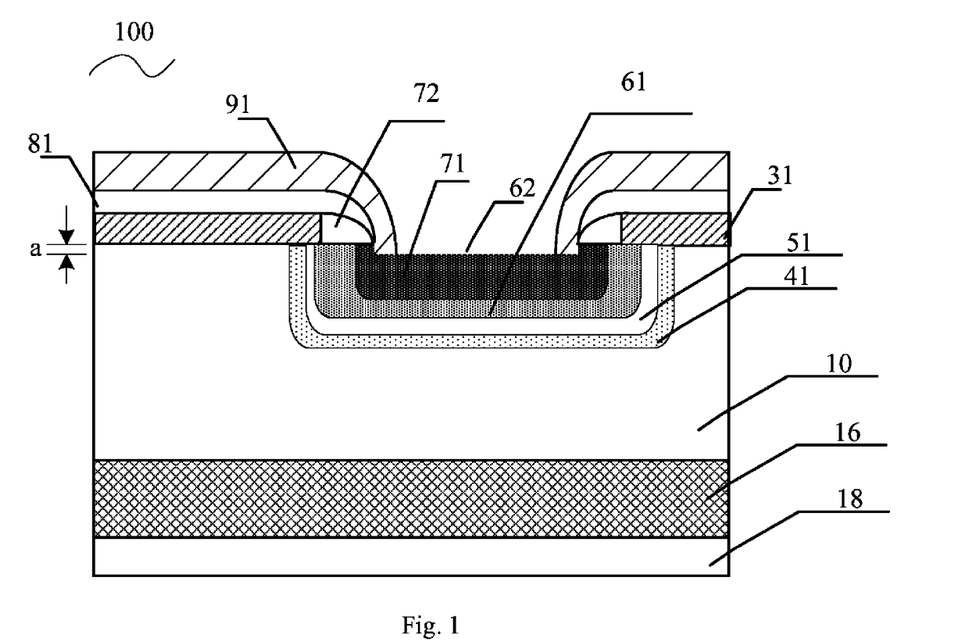
FIG. 1 is a schematic view of an insulated gate bipolar transistor in an embodiment.

FIG. 1 is a schematic view of the insulated gate bipolar transistor 100 in an embodiment, which includes a peripheral terminal structure (not shown in FIG. 1) and an active region surrounded by the terminal structure. A substrate of the insulated gate bipolar transistor 100 is an N-type substrate 10. A back side of the substrate 10 is disposed with a P-type region 16, a back side of the P-type region 16 is disposed with a backside metal structure 18, and a terminal guard ring (not shown in FIG. 1) is disposed in the terminal structure. A front side of the substrate 10 of the active region is disposed with a polysilicon gate 31, both sides of the polysilicon gate 31 on the substrate 10 are disposed with the spacers 72, an interlayer dielectric 81 covering the polysilicon gate 31 and the spacers 72 is disposed on the substrate 10, and the interlayer dielectric 81 is covered by a metal lead layer 91. An N-type carrier enhanced region 41 is disposed in the substrate 10 of the active region, a P-body region 51 is disposed in the carrier enhanced region 41, an N-type heavily doped region 61 is disposed in the P-body region 51, a P-type heavily doped region 71 is disposed in the N-type heavily doped region 61, a surface of the P-type heavily doped region 71 forms a dishing area 62 dished inwardly, and an inwardly dishing depth (i.e. a in FIG. 1) of the dishing area 62 with respect to the substrates at both sides is 0.15 micron to 0.3 micron.

In the insulated gate bipolar transistor described above, by forming the carrier enhanced region 41, a concentration of carriers in a channel can be increased and then the conduction voltage drop can be reduced. Meanwhile, prior to implanting the P-type ions to the N-type heavily doped region 61, the shallow dishing (the dishing area 62) of 0.15 micron to 0.3 micron is formed by etching the P-type heavily doped region 71, which results in a good impurity distribution for the device and a greater metal contacting area, reducing the power consumption, improving reliability of product, and further reducing the conduction voltage.

The substrate 10 is made of silicon, silicon carbide, gallium arsenide, indium phosphide orgermanium-silicon. In one of embodiments, the substrate is made of a monocrystal silicon with a crystal orientation of <100>.

Figure 2:
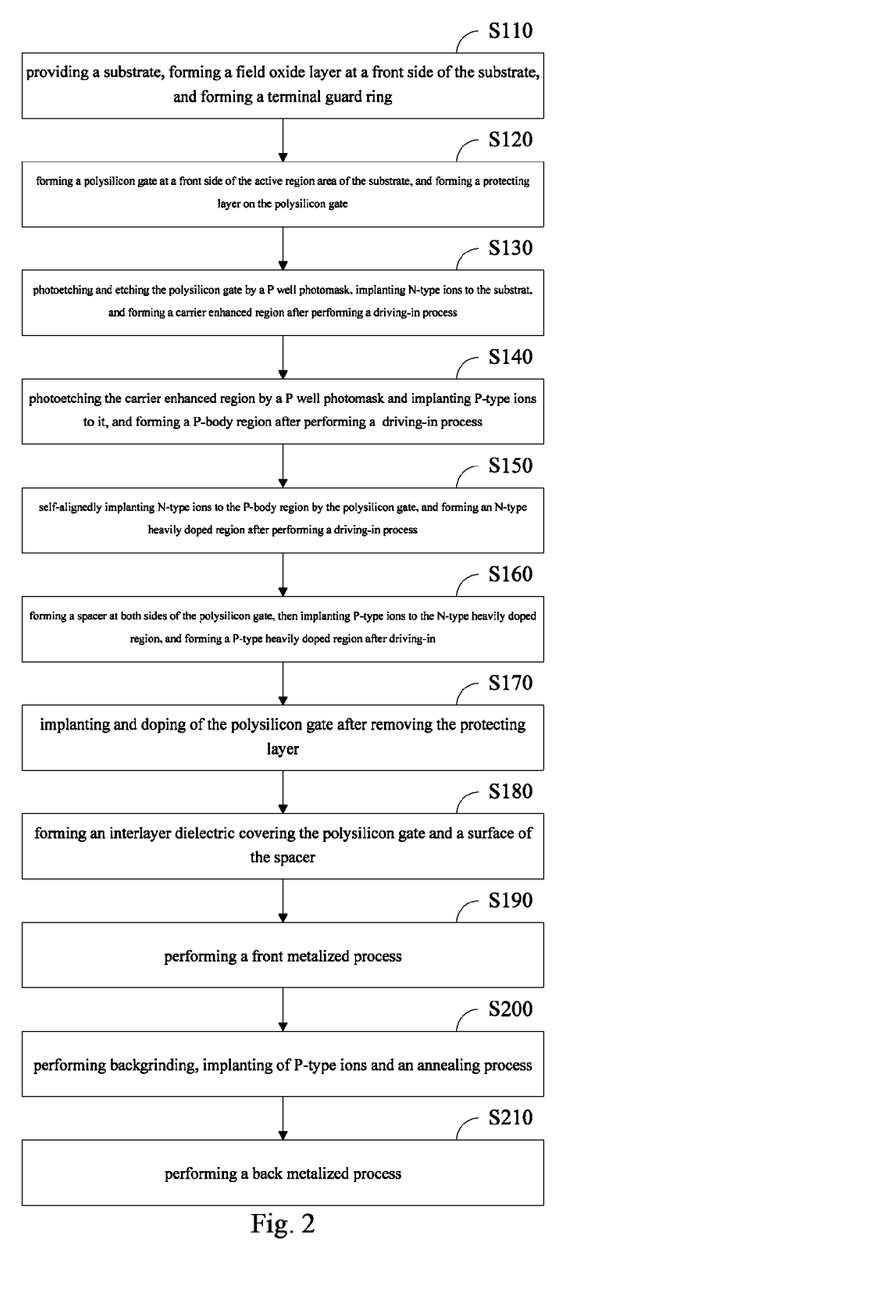
FIG. 2 shows a flow chart of a method of manufacturing the insulated gate bipolar transistor in an embodiment.

Referring to FIG. 2, a method of manufacturing the insulated gate bipolar transistor 100 described above is also provided in the invention, which includes the following steps:

In step S110, a substrate is provided, a field oxide layer is formed on a front side of the substrate, and a terminal guard ring is formed.

The substrate 10 is made of silicon, silicon carbide, gallium arsenide, indium phosphide orgermanium-silicon. In the embodiment, the substrate 10 is made of a monocrystal silicon wafer with a crystal orientation of <100>.

Figure 3A:
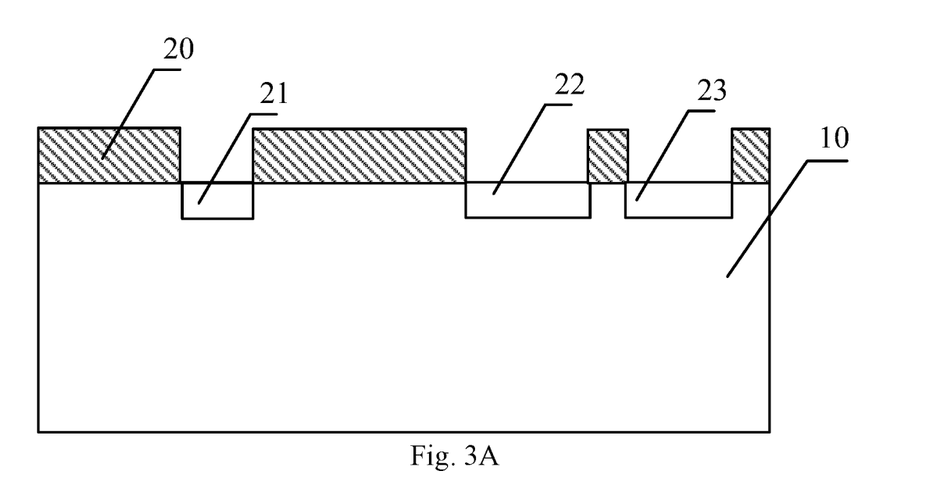
FIGS. 3A to 3F are partial cross-section views of the insulated gate bipolar transistor during manufacturing by using the method of manufacturing the insulated gate bipolar transistor in an embodiment.

In the embodiment, firstly a field oxide layer 20 is grown at the front side of the substrate 10, then the field oxide layer 20 is photoetched and etched directly above the substrate 10 required to form the terminal guard ring by using a terminal guard ring photomask. Then the terminal guard ring is formed through implanting of the P-type ions by using the field oxide layer 20 as a masking layer. Three terminal guard rings 21, 22, 23 are shown in FIG. 3A, wherein a position where the terminal guard ring 23 is located is adjacent to the active region area in the center of the substrate 10. It should be understood that the number of the terminal guard rings is not limited to the present embodiment, and can be selected and configured according to actual requirement for the device by those skilled in the art.

FIG. 3A is a partial cross-section view of the insulated gate bipolar transistor after the step S110 is performed in the embodiment. In the embodiment, the P-type ions implanted in the step S110 are boron ions. It should be understood that the particularly implanted P-type/N-type ions given in each step of implanting of ions in the embodiment are only better embodiments, and in other embodiments they can be replaced with other P-type/N-type ions well known by those skilled in the art.

S120, a polysilicon gate is formed at a front side of the active region area of the substrate, and a protecting layer is formed on the polysilicon gate.

Figure 3B:
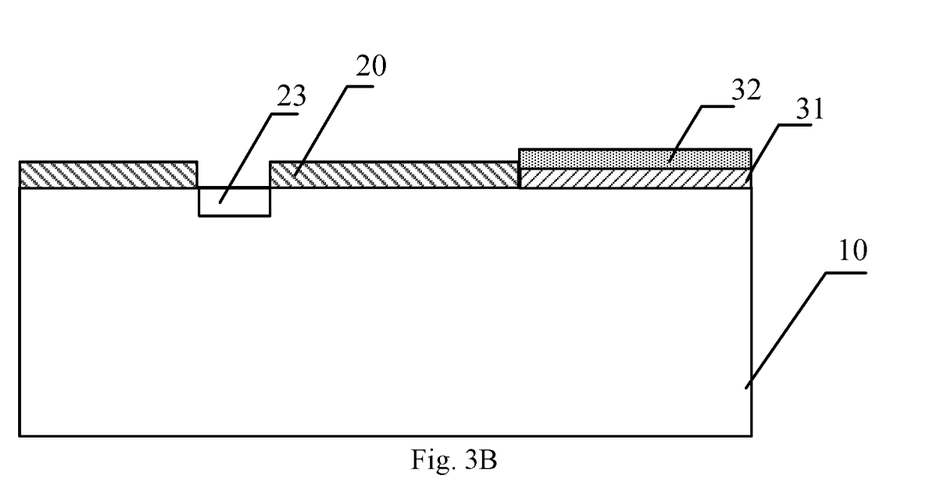

The field oxide layer 20 of the active region area is photoetched and etched by using the active region photomask, polysilicon is deposited on the substrate 10 where the field oxide layer 20 being etched, a protecting layer is formed on the deposited polysilicon; and a polysilicon gate 31 is formed by photoetching and etching a surplus of the polysilicon and the protecting layer with a polysilicon photomask. In the embodiment, the protecting layer comprises a silicon nitride layer 32, wherein prior to depositing silicon nitride it needs to perform one time oxidation. A first oxide layer (not shown in FIG. 3B) is formed at a surface of the deposited polysilicon, and then the silicon nitride layer 32 is formed on the first oxide layer by depositing the silicon nitride. Compared to depositing the silicon nitride directly on the surface of the polysilicon, a first oxide layer is deposited between the polysilicon gate 31 and the silicon nitride layer 32, which can improve the issue related to stress. FIG. 3B is a partial cross-section view of the insulated gate bipolar transistor after the step S120 is performed in the embodiment, the structure shown by which is located at the right side of FIG. 3A.

S130, the polysilicon gate is photoetched and etched by using a P well photomask, and N-type ions are implanted to the substrate, and a carrier enhanced region is formed after performing a driving-in process.

Figure 3C:
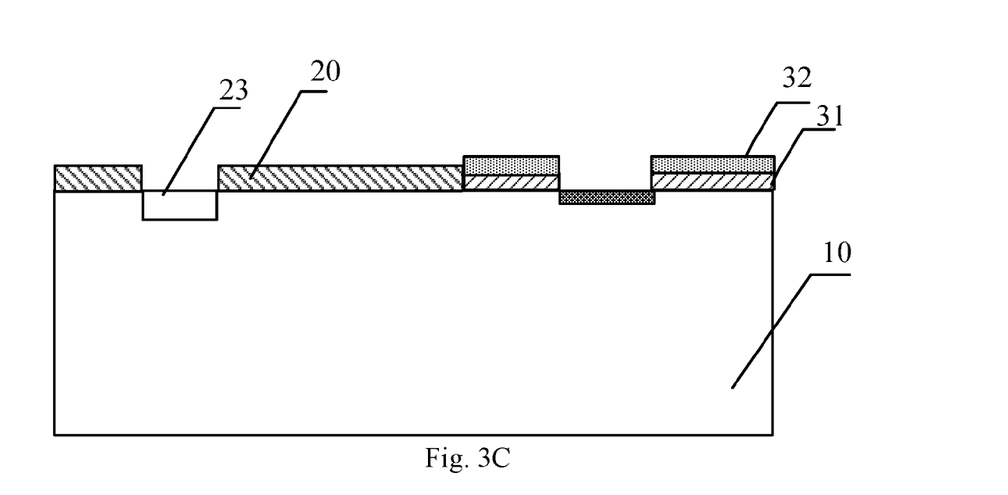

The polysilicon gate 31 is photoetched and etched by using the P well photomask, and N-type ions are implanted to the substrate 10 under the etched polysilicon gate 31. In the embodiment, the N-type ions implanted in step S130 are phosphorous ions. FIG. 3C is a partial cross-section view of the insulated gate bipolar transistor after the phosphorous ions are implanted and when the driving-in process is not performed in the embodiment.

A carrier enhanced region 41 is formed after implanting of ions and through a high temperature driving-in process.

S140, the carrier enhanced region is photoetched by using the P well photomask and P-type ions are implanted to the carrier enhanced region, and a P-body region is formed after performing a driving-in process.

Figure 3D:
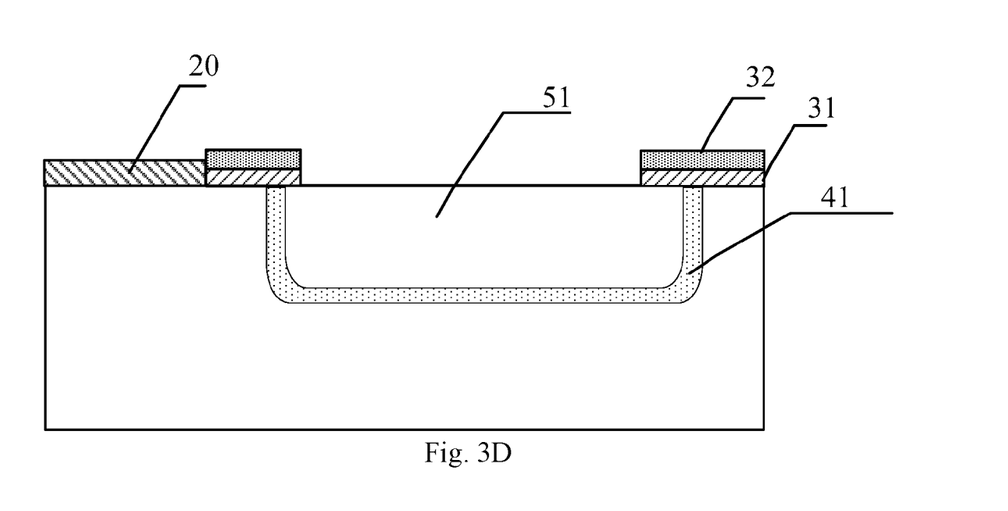

The photomask used in the step S140 is the same as that in step S130. In the embodiment, the P-type ions implanted in step S150 are boron ions, and the P-body region 51 is formed after performing the high temperature driving-in process. FIG. 3D is a partial cross-section view of the insulated gate bipolar transistor after the step S140 is performed in the embodiment, the structure shown by which is located at the right side of FIG. 3C.

S150, N-type ions are self-alignedly implanted to the P-body region by using the polysilicon gate, and an N-type heavily doped region is formed after performing a driving-in process.

Figure 3E:
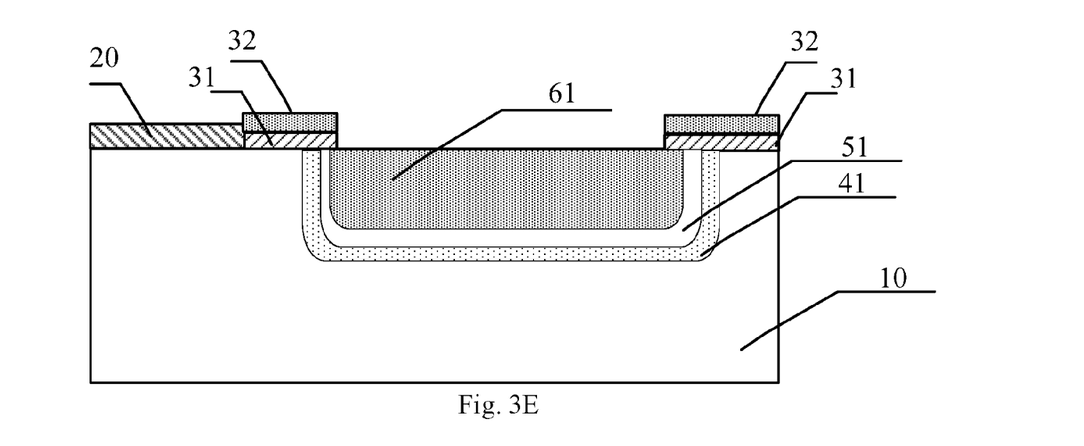

In the embodiment, the N-type ions implanted in step S150 are arsenic ions, and the N-type heavily doped region (NSD) 61 is formed after performing the high temperature driving-in process. FIG. 3E is a partial cross-section view of the insulated gate bipolar transistor after the step S150 is performed in the embodiment.

S160, a spacer at both sides of the polysilicon gate is formed, then P-type ions are implanted to the N-type heavily doped region, and a P-type heavily doped region is formed after performing a driving-in process.

Firstly a second oxide layer is deposited, and then a spacer corrosion process is performed for the device to corrode a surplus of the second oxide layer, for forming the spacer 72 at both sides of the polysilicon gate 31.

In the embodiment, after forming the spacer 72, and prior to implanting the P-type ions to the N-type heavily doped region 61, the method further comprises silicon-etching the N-type heavily doped region 61 and forming a dishing area. The dishing area 62 is a shallow dishing the inwardly dishing depth of which is 0.15 micron to 0.3 micron.

Prior to implanting the P-type ions to the N-type heavily doped region 61, the shallow dishing (the dishing area 62) of 0.15 micron to 0.3 micron is formed by etching the P-type heavily doped region, which results in a good impurity distribution and a greater metal contacting area for the device, reducing the power consumption, improving reliability of product, and further reducing the conduction voltage.

After forming the etched dishing area 62, the P-type ions are implanted. In the embodiment, the implanted P-type ions are boron ions. After performing the implantation process, the high temperature driving-in process is performed to form the P-type heavily doped region (PSD) 71.

S170, the implantation and doping processes are performed for the polysilicon gate after removing the protecting layer.

Figure 3F:
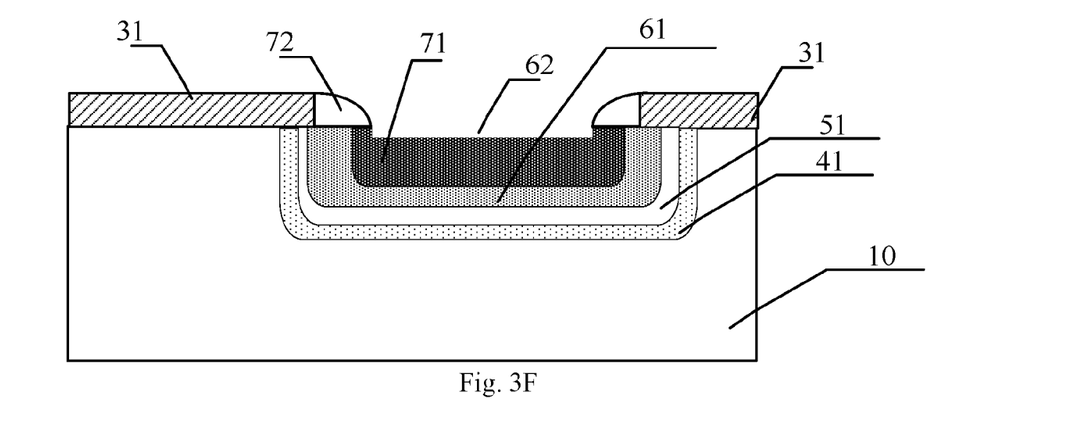

As mentioned previously, the protecting layer in the embodiment comprises the silicon nitride layer 32. After removing the silicon nitride layer 32 at the surface of the polysilicon gate 31, the N-type ions are implanted and doped to the polysilicon gate 31. In the embodiment, the implantation and doping processes for the polysilicon gate are performed after performing the photoetching process by using the polysilicon photomask. FIG. 3F is a partial cross-section view of the insulated gate bipolar transistor after the step S170 is performed in the embodiment.

After the step S170 is performed, the interlayer dielectric (ILD) can be generated regularly, and the processes of front metallization, backgrinding, implantation and annealing, backside metallization and so on can be performed. Similarly, a specific embodiment is described as follows:

S180, an interlayer dielectric covering the surfaces of the polysilicon gate and the spacer is formed.

After depositing borophosphosilicate glass (BPSG) at the surface of the device, a hot reflow process is performed, for forming the interlayer dielectric 81 covering the surfaces of the polysilicon gate 31 and the spacer 72.

S190, the front metallization process is performed.

A contact hole is formed by performing photoetching and etching processes by using a contact hole photomask, and a conductive metal is sputtered at the surface of the device, then the conductive metal is etched by using a metal photomask, and a metal lead layer 91 covering the interlayer dielectric 81 is formed.

S200, the backgrinding, P-type ions implantation and annealing processes are performed.

The back side of the substrate 10 is ground to the required thickness, the P-type ions are implanted to the back side of the substrate 10 and the annealing process is performed, for forming a P-body region 16. A substrate PN junction is formed by the P-body region 16 and the substrate 10. In the embodiment, the P-type ions implanted in the step S200 are boron ions.

S210, the backside metallization process is performed.

The conductive metal is sputtered at the back side of the substrate 10, and a backside metal structure 18 is formed at the surface of the P-type region 16 as the collector metal lead. FIG. 1 is a partial cross-section views of the insulated gate bipolar transistor 100 after the step S210 is performed in the embodiment In the method of manufacturing an insulated gate bipolar transistor described above, when the polysilicon gate 31 is etched by using the region-type photomask in the step S130, the phosphorous ions is implanted, for increasing the concentration of the carrier in the channel, a carrier enhanced region 41 is formed and then the conduction voltage drop is reduced.

Six photomasks are used during the above manufacturing process, which are the terminal guard ring photomask, the active region photomask, the polysilicon photomask, the P well photomask, the contact hole photomask, and the metal photomask. The ions implantation of the carrier enhanced region 41 and the P-body region uses the same photomask (i.e. P well photomask), which saving cost.

Meanwhile, the method of manufacturing the insulated gate bipolar transistor describe above is compatible with the DMOS process, and has the advantages of universality, portability for different IC production lines and so on.

In one of embodiments, after forming the contact hole by performing photoetching and etching processes by using the contact hole photomask in step S190, and prior to sputtering a metal, the PSD implantation can be also performed again, for implanting P-type ions to the P-type heavily doped region to obtain a good ohm contact and improve performance of the device.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. An insulated gate bipolar transistor, comprising:
a substrate that is an N-type substrate;

an active region surrounded by a peripheral terminal structure, a terminal guard ring being disposed in the peripheral terminal structure;

a P-type region, a back side of the N-type substrate being disposed with the P-type region;

a backside metal structure, a back side of the P-type region being disposed with the backside metal structure;

a polysilicon gate, a front side of the substrate of the active region being disposed with the polysilicon gate, both side surfaces of the polysilicon gate on the substrate being disposed with a spacer; and an interlayer dielectric disposed on the substrate and covering the polysilicon gate and the spacer, the interlayer dielectric being covered by a metal lead layer, wherein an N-type carrier enhanced region is disposed in the active region of the substrate, a P-body region is disposed in the N-type carrier enhanced region, an N-type heavily doped region is disposed in the P-body region, and a P-type heavily doped region is disposed in the N-type heavily doped region, the P-type heavily doped region being disposed between the N-type heavily doped region and the metal lead layer such that the metal lead layer does not contact the N-type heavily doped region, wherein a surface of the P-type heavily doped region forms a dishing area dished inwardly, and an inwardly dishing depth of the dishing area with respect to the substrate is 0.15 micron to 0.3 micron.

2. The insulated gate bipolar transistor of claim 1, wherein the substrate is made of one or more of silicon, silicon carbide, gallium arsenide, and indium phosphide or germanium-silicon.

3. The insulated gate bipolar transistor of claim 2, wherein the substrate is made of monocrystal silicon with a crystal orientation of <100>.

4. A method of manufacturing the insulated gate bipolar transistor of claim 1, comprising:

providing a substrate, forming a field oxide layer on a front side of the substrate, photoetching and etching the field oxide layer by using a terminal guard ring photomask, and forming a terminal guard ring by implanting P-type ions to the substrate under the etched area;

photoetching and etching the field oxide layer of an active region area by using an active region photomask, and depositing polysilicon on the substrate where the field oxide layer being etched, forming a protecting layer on the deposited polysilicon; and forming a polysilicon gate by photoetching and etching surplus polysilicon and the protecting layer by using a polysilicon photomask;

photoetching and etching the polysilicon gate by using a P well photomask, implanting N-type ions to the substrate under the etched polysilicon gate, and forming a carrier enhanced region after performing a driving-in process;

photoetching the carrier enhanced region by using the P well photomask and implanting P-type ions to the carrier enhanced region, and forming a P-body region after performing a driving-in process;

self-alignedly implanting N-type ions to the P-body region by using the polysilicon gate, and forming an N-type heavily doped region after performing a driving-in process;

forming a spacer at both sides of the polysilicon gate, then implanting P-type ions to the N-type heavily doped region, and forming a P-type heavily doped region after performing a driving-in process;

implanting and doping polysilicon to the polysilicon gate after removing the protecting layer; and forming an interlayer dielectric, performing a front metalized process of the insulated gate bipolar transistor, performing backgrinding, implanting of P-type ions and an annealing process, and performing a backside metalized process of the insulated gate bipolar transistor.

5. The method of manufacturing the insulated gate bipolar transistor of claim 4, wherein after forming the spacer at both sides of the polysilicon gate and prior to the step of implanting P-type ions to the N-type heavily doped region, the method further comprises forming a dishing area by etching the N-type heavily doped region, wherein an inwardly sunken depth of the dishing area with respect to the substrates at both sides is 0.15 micron to 0.3 micron.

6. The method of manufacturing the insulated gate bipolar transistor of claim 4, wherein forming the protecting layer on the deposited polysilicon comprises forming a first oxide layer at a surface of the polysilicon, and depositing a silicon nitride layer at a surface of the first oxide layer.

7. The method of manufacturing the insulated gate bipolar transistor of claim 4, wherein after performing the front metalized process of the insulated gate bipolar transistor, the method further comprises implanting P-type ions to the P-type heavily doped region again.

8. The method of manufacturing the insulated gate bipolar transistor of claim 4, wherein in the step of forming the terminal guard ring by implanting P-type ions to the substrate under the etched area, the P-type ions are boron ions; in the step of implanting N-type ions to the substrate under the etched polysilicon gate, the N-type ions are phosphorous ions; in the step of photoetching the carrier enhanced region by using a P well photomask and implanting P-type ions to the carrier enhanced, the P-type ions are boron ions; in the step of self-alignedly implanting N-type ions to the P-body region by using the polysilicon gate, the N-type ions are arsenic ions; in the step of implanting P-type ions to the N-type heavily doped region, the P-type ions are boron ions; in the step of implanting and doping polysilicon to the polysilicon gate after removing the protecting layer, the implanted ions are phosphorous ions.

9. The method of manufacturing the insulated gate bipolar transistor of claim 4, wherein the step of forming the spacer at both sides of the polysilicon gate comprises: depositing a second oxide layer, then removing a surplus of the second oxide layer by corroding, and forming the spacer by the remaining part of the second oxide layer.

10. The method of manufacturing the insulated gate bipolar transistor of claim 4, wherein the step of performing the front metalized process of the insulated gate bipolar transistor comprises: forming a contact hole by performing photoetching and etching processes by using a contact hole photomask, and sputtering a conductive metal on the interlayer dielectric, then forming a metal lead layer covering the interlayer dielectric by photoetching and etching the sputtered metal with a metal photomask.

* * * * *